(12) United States Patent
Kim

(10) Patent No.: US 11,252,365 B2
(45) Date of Patent: Feb. 15, 2022

(54) CLOCK GENERATOR AND IMAGE SENSOR INCLUDING THE SAME

(71) Applicant: SK hynix Inc., Icheon-si (KR)

(72) Inventor: Tae Gyu Kim, Namyangju-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/510,240

(22) Filed: Jul. 12, 2019

(65) Prior Publication Data

US 2020/0221046 A1    Jul. 9, 2020

(30) Foreign Application Priority Data

Jan. 3, 2019 (KR) .................. 10-2019-0000508

(51) Int. Cl.
| | |
|---|---|
| *H04N 5/376* | (2011.01) |
| *H03L 7/089* | (2006.01) |
| *H04N 5/3745* | (2011.01) |
| *H04N 5/378* | (2011.01) |
| *H03L 7/099* | (2006.01) |

(52) U.S. Cl.
CPC ......... *H04N 5/3765* (2013.01); *H03L 7/0891* (2013.01); *H03L 7/099* (2013.01); *H04N 5/378* (2013.01); *H04N 5/3745* (2013.01)

(58) Field of Classification Search
None
See application file for complete search history.

(56) References Cited

U.S. PATENT DOCUMENTS

| | | | |
|---|---|---|---|
| 9,438,102 B2 | 9/2016 | Kim | |
| 2006/0119439 A1* | 6/2006 | Horan | A61L 27/18 331/16 |
| 2007/0188242 A1* | 8/2007 | Song | H03L 7/0898 331/16 |

(Continued)

FOREIGN PATENT DOCUMENTS

| | | |
|---|---|---|
| CN | 1377521 A | 10/2002 |
| CN | 107623521 A | 1/2018 |

(Continued)

OTHER PUBLICATIONS

Office Action dated Feb. 9, 2021 in Chinese Patent Application No. 201910699698.3, 23 pages with English translation.

*Primary Examiner* — Quan Pham
(74) *Attorney, Agent, or Firm* — Perkins Coie LLP

(57) ABSTRACT

A clock generator and an image sensor including the same are disclosed, which relate to technology for improving an operation speed of a voltage controlled oscillator. The clock generator includes a phase frequency detector (PFD) configured to detect a phase difference between a clock signal and a reference clock signal, a voltage converter configured to adjust a current corresponding to a voltage level in response to an output signal of the phase frequency detector (PFD), a filter circuit configured to generate a control voltage by filtering an output signal of the voltage converter, a voltage pumping circuit configured to pump an output voltage of the voltage converter, and provide the control voltage having a pumped voltage level, and a voltage controlled oscillator configured to generate a clock signal, an oscillation frequency of which is adjusted, in response to the control voltage.

20 Claims, 5 Drawing Sheets

(56) References Cited

U.S. PATENT DOCUMENTS

| | | | | |
|---|---|---|---|---|
| 2008/0291770 A1* | 11/2008 | Ishikawa | ............... | H03L 7/0895 |
| | | | | 365/233.1 |
| 2009/0160511 A1* | 6/2009 | Sudo | .................... | H03L 7/0893 |
| | | | | 327/157 |
| 2010/0156542 A1* | 6/2010 | Lee | ....................... | H03L 7/0891 |
| | | | | 331/34 |
| 2012/0086483 A1* | 4/2012 | Suzuki | ...................... | H03L 7/18 |
| | | | | 327/156 |
| 2013/0271191 A1* | 10/2013 | Hasegawa | ............... | H03L 7/093 |
| | | | | 327/157 |
| 2014/0132308 A1* | 5/2014 | Katyal | .................... | H03L 7/095 |
| | | | | 327/102 |
| 2017/0093408 A1* | 3/2017 | Jia | ........................... | H03L 7/099 |
| 2017/0179964 A1* | 6/2017 | Rombach | ................. | H03L 7/103 |
| 2017/0214408 A1* | 7/2017 | Liang | ................... | H03M 1/1009 |
| 2019/0007566 A1* | 1/2019 | Kanno | ................. | H04N 5/3745 |

FOREIGN PATENT DOCUMENTS

| | | |
|---|---|---|
| CN | 108713315 A | 10/2018 |
| KR | 10-1764659 | 8/2017 |

* cited by examiner

CLOCK GENERATOR AND IMAGE SENSOR INCLUDING THE SAME

CROSS-REFERENCE TO RELATED APPLICATION

This patent document claims priority to and benefits of Korean patent application No. 10-2019-0000508, filed on Jan. 3, 2019, which is incorporated herein by reference in its entirety.

TECHNICAL FIELD

The technology and implementations disclosed in this patent document generally relate to a clock generator and an image sensor including the same.

BACKGROUND

Generally, a Complementary Metal Oxide Semiconductor (CMOS) Image Sensor (CIS) implemented by a CMOS process has been developed to have lower power consumption, lower costs, and smaller sizes than other competitive products. Thus, CMOS image sensors (CISs) have been intensively researched and rapidly come into widespread use. Specifically, CMOS image sensors (CISs) have been developed to have higher image quality than other competitive products, such that the application scope of CMOS image sensors (CISs) has recently been extended to video applications that require higher resolution and higher frame rate as compared to competitive products.

Differently from a solid state image pickup device, it is necessary for the CMOS image sensor (CIS) to convert analog signals (pixel signals) generated from a pixel array into digital signals. In order to convert analog signals into digital signals, the CMOS image sensor (CIS) has been designed to include a high-resolution Analog-to-Digital Converter (ADC).

The analog-to-digital converter (ADC) may perform correlated double sampling about an analog output voltage indicating an output signal of the pixel array, and may store the resultant voltage in one or more line memories. A digital processing circuit may output one or more image signals by processing the digital signal generated from the line memory.

SUMMARY

Various implementations of the disclosed technology are directed to a clock generator and an image sensor including the same.

Some implementations of the disclosed technology relate to a clock generator for extending an output range of a voltage controlled oscillator, and an image sensor including the clock generator.

In one aspect, a clock generator is provided to include a phase frequency detector (PFD) configured to receive a clock signal and a reference clock signal and detect a phase difference between the clock signal and the reference clock signal, the phase frequency detector providing a first output signal based on the phase difference, a voltage converter communicatively coupled to the phase frequency detector to receive the first output signal from the phase frequency detector and configured to provide a second output signal based on the first output signal from the phase frequency detector (PFD), a filter circuit communicatively coupled to the voltage converter to receive the second output signal from the voltage converter and configured to generate a control voltage by filtering the second output signal from the voltage converter, a voltage pumping circuit communicatively coupled to the voltage converter and configured to pump an output voltage of the voltage converter, the voltage pumping circuit providing a pumped control voltage having a pumped voltage level, and a voltage controlled oscillator communicatively coupled to the filter circuit and the voltage pumping circuit and configured to generate a clock signal having an oscillation frequency that is determined based on the control voltage or the pumped control voltage.

In another aspect, a clock generator is provided to include a filter circuit configured to operate, during a normal operation, to provide a control voltage and store charges in the filter circuit, a voltage pumping circuit configured to operate, during a pumping operation, to generate a pumped control voltage by using the charges stored in the filter circuit the pumped control voltage being higher than the control voltage, and a voltage controlled oscillator configured to generate a clock signal, having an oscillation frequency that is determined based of the control voltage during the normal operation and based on the pumped control voltage during the pumping operation.

In accordance with another embodiment of the present disclosure, an image sensor may include an analog-to-digital converter (ADC) circuit configured to convert a plurality of pixel signals into at least one digital signal, a data output circuit configured to receive the at least one digital signal from the ADC circuit and outputting pixel data based on the at least one digital signal, a digital processing circuit configured to receive the pixel data from the data output circuit and perform a signal processing of the pixel data based on a clock signal, and a clock generator configured to generate the clock signal. The clock generator may include a filter circuit configured to operate, during a normal operation, to provide a control voltage and store charges in the filter circuit, a voltage pumping circuit configured to operate, during a pumping operation, to generate a pumped control voltage by using the charges stored in the filter circuit the pumped control voltage to be equal to or higher than a power-supply voltage, and a voltage controlled oscillator configured to generate a clock signal having an oscillation frequency that is determined based on the control voltage during the normal operation and based on the pumped control voltage during the pumping operation.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The above and other features and advantages of the disclosed technology will become readily apparent by reference to the following detailed description when considered in conjunction with the accompanying drawings.

DESCRIPTION OF EMBODIMENTS

Reference will now be made in detail to embodiments of the disclosed technology, examples of which are illustrated in the accompanying drawings. The same reference numbers are used throughout the drawings to refer to the same or like portions.

Figure 1:
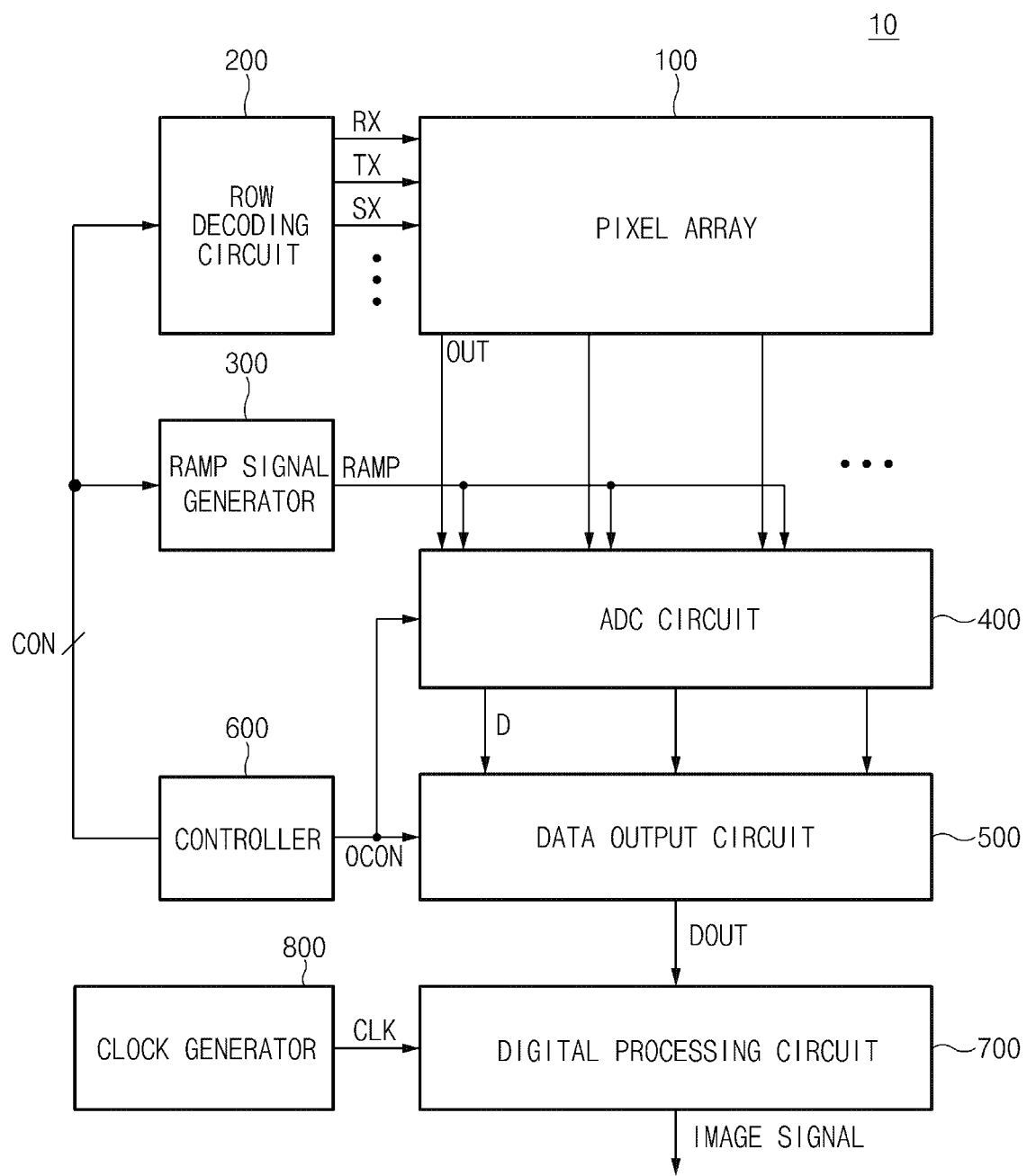
FIG. 1 is a schematic diagram illustrating a representation of an example of an image sensor including a clock generator based on some implementations of the disclosed technology.

FIG. 1 is a schematic diagram illustrating an example of an image sensor based on some implementations of the disclosed technology.

Referring to FIG. 1, the image sensor 10 may include a pixel array 100, a row decoding circuit 200, a ramp signal generator 300, an analog-to-digital converter (ADC) circuit 400, a data output circuit 500, a controller 600, a digital processing circuit 700, and a clock generator 800.

The pixel array 100 may convert an incident light signal into an electrical signal, and may output an analog pixel signal OUT to the ADC circuit 400. In this case, the pixel array 100 may be driven by various drive signals, for example, a reset signal RX, a transmission signal TX, a selection signal SX, etc. that are received from the row decoding circuit 200.

The row decoding circuit 200 may be communicatively coupled to the pixel array 100 and the controller 600, select at least one pixel for each row line among pixels contained in the pixel array 100 based on a control signal CON received from the controller 600, and control operations of the selected pixel.

The ramp signal generator 300 may be communicatively coupled to the ADC circuit 400 and the controller 600, generate a ramp signal RAMP in response to the control signal CON received from the controller 600, and output the ramp signal RAMP to the ADC circuit 400.

The ADC circuit 400 may be communicatively coupled to the pixel array 100, the ramp signal generator 300, and the data output circuit 500. The ADC circuit 400 may convert an analog pixel signal OUT received from the pixel array 100 into a digital signal. The ADC circuit 400 may compare the pixel signal OUT received from the pixel array 100 with the ramp signal RAMP received from the ramp signal generator 300, and thus output a result of comparison between the pixel signal OUT and the ramp signal RAMP to the data output circuit 500. The ADC circuit 400 may output a column-based digital signal D based on the result of comparison between the pixel signal OUT and the ramp signal RAMP.

The data output circuit 500 may be communicatively coupled to the ADC circuit 400, the controller 600, and the digital processing circuit 700. The data output circuit 500 may latch or hold the digital signal D received from the ADC circuit 400. The data output circuit 500 may latch or hold counting information and may sequentially output pixel data DOUT in response to an output control signal OCON.

The controller 600 may be communicatively coupled to the row decoding circuit 200, the ramp signal generator 300, the ADC circuit 400, and the data output circuit 500 and control the row decoding circuit 200, the ramp signal generator 300, the ADC circuit 400, and the data output circuit 500. In some implementations, the controller 600 may include a timing generator. Thus, the controller 600 may control, based on time information, an overall procedure including sensing image data and outputting the sensed image data.

The controller 600 may generate a control signal CON, and may output the control signal CON to the row decoding circuit 200 and the ramp signal generator 300. The controller 600 may generate an output control signal OCON, and may output the output control signal OCON to the ADC circuit 400 and the data output circuit 500. The digital processing circuit 700 may be communicatively coupled to the data output circuit 500 and include an image signal processor (ISP). The digital processing circuit 700 may output at least one image signal by processing pixel data DOUT received from the data output circuit 500 in a digital domain. In some implementations, the digital processing circuit 700 may be also coupled to the clock generator 800 and process the image signal based on a clock signal CLK received from the clock generator 800.

The clock generator 800 may generate a clock signal CLK to be used for synchronizing each block, and may output the generated clock signal CLK to the digital processing circuit 700. In some implementations, the clock generator 800 may include a phase locked loop (PLL).

The clock generator 800 may repeatedly perform a feedback operation of a loop until the clock signal CLK has a same phase as that of a reference clock signal. When the clock signal CLK has the same phase as that of the reference clock signal, the clock signal CLK may be locked into the reference clock signal.

In some implementations of the disclosed technology, the clock generator 800 may increase an oscillation frequency of the clock signal CLK and transmit the increased oscillation frequency to the digital processing circuit 700. By including the clock generator 800 configured to provide the increased oscillation frequency to the digital processing circuit 700, the image sensor 10 can allow the digital processing circuit 700 to perform the image signal processing at a higher speed.

Figure 2:
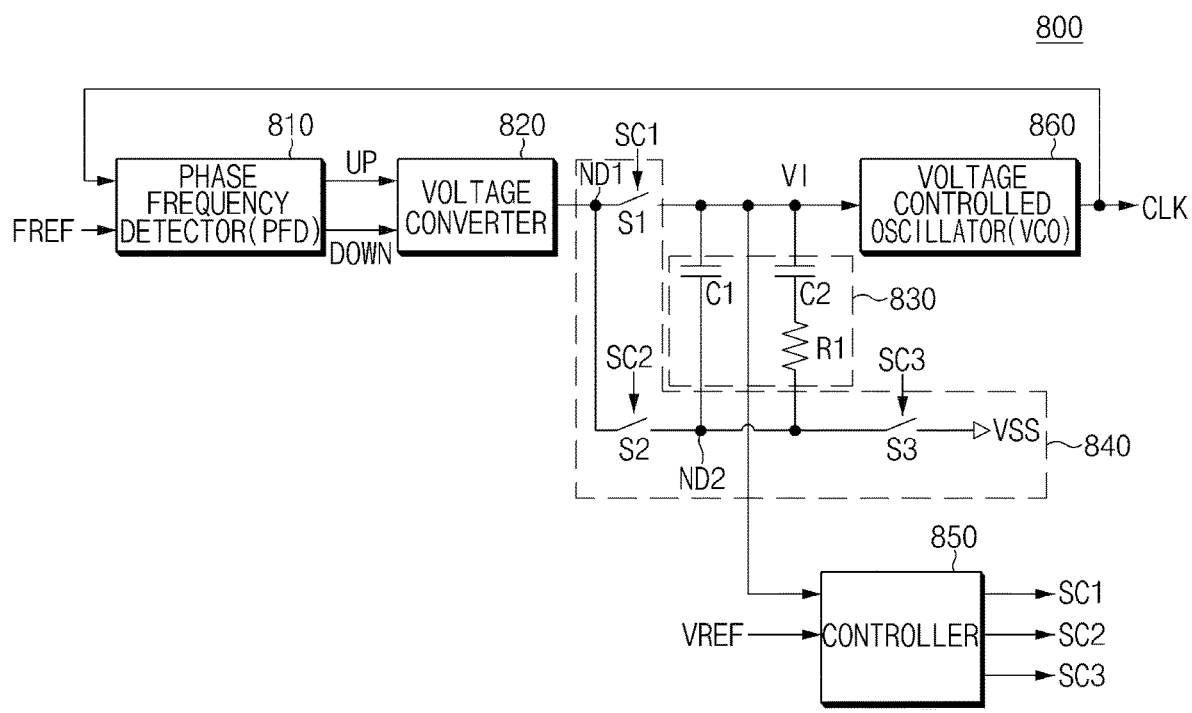
FIG. 2 is a schematic diagram illustrating a representation of an example of the clock generator shown in FIG. 1 based on some implementations of the disclosed technology.

FIG. 2 is a schematic diagram illustrating the clock generator 800 shown in FIG. 1 based on some implementations of the disclosed technology.

Referring to FIG. 2, the clock generator 800 may include a phase frequency detector (PFD) 810, a voltage converter 820, a filter circuit 830, a voltage pumping circuit 840, a controller 850, and a voltage controlled oscillator (VCO) 860.

The phase frequency detector (PFD) 810 may detect a phase of the clock signal CLK received as a feedback input, and a phase of a reference clock signal FREF. In some implementations, the reference clock signal FREF may have a fixed phase and a fixed frequency. The phase frequency detector (PFD) 810 may compare the clock signal with the reference clock signal FREF. The PFD 810 may output an up detection signal UP and a down detection signal DOWN to the voltage converter 820. The detection signal Up and the down detection signal down correspond to a phase difference between the clock signal CLK and the reference clock signal FREF, to the voltage converter 820.

In this case, the reference clock signal FREF may be received from an external circuit or device through wired or wireless communication, or may be an oscillation signal generated by an internal or external oscillator. For example, the reference clock FREF may be a fixed oscillation signal generated by a crystal oscillator (not shown).

The voltage converter 820 may perform voltage conversion in response to or based on the up detection signal IP or the down detection signal DOWN, may provide an output signal, for example, a current corresponding to the converted voltage level, to a node ND1. The voltage converter 820 may include a charge pumping circuit or a voltage-to-current (V-I) converter.

In some implementations, the charge pumping circuit may receive the up detection signal UP and the down detection signal DOWN, and provide an output current to the node ND1 using the up detection signal UP and the down detection signal DOWN that are received from PFD 810. The V-I converter may receive the up detection signal UP and the down detection signal DOWN, and may provide an output current having a current value corresponding to a voltage level using the up detection signal UP and the down detection signal DOWN that are received from PFD 810.

The filter circuit 830 may generate a control voltage VI by filtering a voltage applied to the node ND1. The filter circuit 830 may operate to maintain a constant control voltage VI. Thus, the constant control voltage VI can be output to the voltage controlled oscillator (VCO) 860. In some implementations, the filter circuit 830 may include a low pass filter (LPF), for example, a loop filter. The filter circuit 830 may remove high-frequency noise contained in the output current output from the voltage converter 820 and applied to the node ND1.

The filter circuit 830 may include capacitors C1 and C2 and a resistor R1. The capacitor C1 may be coupled between an input terminal of the control voltage VI and a node ND2. The capacitor C2 may be coupled between the control voltage (VI) input terminal and the resistor R1. The resistor R1 may be coupled between the capacitor C2 and the node ND2.

The voltage pumping circuit 840 may pump an output voltage of the voltage converter 820 which is applied at the node ND1 and provide a pumped control voltage VI to the voltage controlled oscillator (VCO) 860. The voltage pumping circuit 840 may include a plurality of switching elements S1 to S3. In a normal operation, which will be discussed more later in this specification, the switching elements S1 and S3 of the voltage pumping circuit 840 may be turned on and a normal path including the capacitors C1 and C2 may be formed in the filter circuit 830. In a pumping operation that proceeds after the normal operation, the switching element S2 of the voltage pumping circuit 840 may be turned on and the output voltage of the voltage converter 820 is pumped using a voltage charged in the filter circuit 830.

In some implementations, the switching element S1 may be coupled between the node ND1 and the control voltage (VI) input terminal and the switching operation of the switching element S1 may be controlled by a switching control signal SC1. The switching element S2 may be coupled between the node ND1 and the node ND2 and the switching operation of the switching element S2 may be controlled by a switching control signal SC2. The switching element S3 may be coupled between the node ND2 and the ground voltage (VS S) input terminal and the switching operation of the switching element S3 may be controlled by a switching control signal SC3.

The controller 850 may generate a plurality of switching control signals SC1 to SC3 based on the reference voltage VREF and the control voltage VI. The controller 850 may compare the reference voltage VREF with the control voltage VI and the controller 850 may selectively activate the plurality of switching control signals SC1 to SC3. In some implementations, the reference voltage (VREF) level may be set as a half of a power-supply voltage (VDD) level.

The voltage controlled oscillator (VCO) 860 may receive the control voltage VI from the filter circuit 830 and the pumped control voltage VI from the voltage pumping circuit 840. The voltage controlled oscillator (VCO) 860 may thus generate the clock signal CLK using the received control voltage VI including the control voltage VI or the pumped control voltage VI. The voltage controlled oscillator (VCO) 860 may generate a clock signal CLK having an oscillation frequency corresponding to the control voltage VI or the pumped control voltage VI.

For example, the voltage controlled oscillator (VCO) 860 may generate a clock signal CLK having an oscillation frequency that is proportional to the control voltage VI. The voltage controlled oscillator (VCO) 860 may increase or decrease an oscillation frequency of the clock signal CLK based on the control voltage VI.

The voltage controlled oscillator (VCO) 860 may be designed to have linear characteristics to the magnitude of the control voltage VI. Since a voltage applied to the voltage converter 820 is not higher than the power-supply voltage, the magnitude of the control voltage VI generated based on the output signal of the voltage converter 820 may be limited, which results in the limitation on the oscillation frequency of the voltage controlled oscillator (VCO). It can be considered to increase the voltage applied to the voltage converter 820 to avoid the limitation on the oscillation frequency of the voltage controlled oscillator. However, if increasing the voltage applied to the voltage converter 820 to a level as high as or higher than the power-supply voltage, power consumption significantly increases.

Therefore, the clock generator 800 based on some implementations of the disclosed technology may suggest an approach to increase the control voltage (VI) level as high as or higher than the power-supply voltage level using the voltage pumping circuit 840. By doing so, it is possible to increase an operation speed of the voltage controlled oscillator (VCO) 860 without causing the significant power consumption.

Operations of the above-mentioned clock generator 800 are explained more detail in the below.

The phase frequency detector (PFD) 810 may detect a phase of the clock signal CLK provided as a feedback input signal and a phase of the reference clock signal FREF and output the up detection signal UP or the down detection signal down based on the detection. For example, when the phase of the reference clock signal FREF is leading the phase of the clock signal CLK, the phase frequency detector (PFD) 810 may provide or activate the up detection signal UP. In contrast, when the phase of the reference clock signal FREF is lagging the phase of the clock signal CLK, the phase frequency detector (PFD) 810 may provide or activate the down detection signal DOWN.

The voltage converter 820 may receive the up detection signal UP or the down detection signal DOWN from the phase frequency detector (PFD) 810 and provide the output current to the node ND1 based on the up detection signal UP or the down detection signal DOWN. For example, when the up detection signal UP is activated, the voltage converter 820 may output the output current with the increased value to the node ND1. In contrast, when the down detection signal DOWN is activated, the voltage converter 820 may output the output current with the reduced value to the node ND1.

When the up detection signal UP is activated, the filter circuit 830 may receive the increased output current from the voltage converter 820 and increase the control voltage VI based on the increased output current. In contrast, when the down detection signal DOWN is activated, the filter circuit 830 may receive the reduced output current from the voltage converter 820 and reduce the control voltage VI based on the reduced current.

The voltage pumping circuit 840 may increase the control voltage (VI) level by pumping the voltage applied at node ND1, and output the pumped control voltage (VI) to the voltage controlled oscillator (VCO) 860.

The operations of the filter circuit 830 and the voltage pumping circuit 840 are further discussed in accordance with time sequence. For example, in a normal operation, the controller 850 may activate switching control signals SC1 and SC3, such that the switching element S1 may be turned on in response to the switching control signal SC1, and the switching element S3 may be turned on in response to the switching control signal SC3. In this case, the filter circuit 830 may perform a filtering operation. During the normal operation, the controller 850 may deactivate the switching control signal SC2 and the switching element S2 may remain turned off.

Subsequently, when the frequency of the clock signal CLK becomes equal to or higher than a predetermined level, the phase frequency detector (PFD) 810 may detect the increased frequency of the clock signal CLK. The phase frequency detector (PFD) 810 activates the up detection signal UP when the phase of the reference clock signal FREF is leading the phase of the clock signal CLK. The voltage converter 820 may increase the level of the output current flowing the node ND1 based on the up detection signal UP. As a result, a level of the control voltage VI that is applied to the node ND1 may increase. When the level of the output current from the voltage converter 820 is equal to or higher than the predetermined level, the voltage converter 820 may be stop a conversion operation, such that the voltage converter 820 may be initialized.

The controller 850 may monitor or detect a voltage level of the node ND1. When the control voltage VI is equal to or higher than the reference voltage signal VREF, the controller 850 may activate the switching control signal SC2, which causes the pumping operation proceeds. Accordingly, the switching elements S1 and S3 may be turned off, and the switching element S2 may be turned on, such that the voltage converter 820 may resume the conversion operation.

In the pumping operation, Although the switching elements S1 and S3 are turned off, each of the capacitors C1 and C2 of the filter circuit 830 have been already charged with the control voltage VI by the normal operation. When the switching element S2 is turned on and the switching elements S1 and S3 are turned off, a discharge path of the ground voltage stage is cut off and thus, the pumping operation of the voltage pumping circuit 840 is carried out.

Thus, the voltage that has already been charged in the capacitors C1 and C2 may be added or pumped to the voltage applied at the node ND1 and generated by operation of the voltage converter 820. Therefore, the pumped control voltage (VI) which has a specific voltage level (e.g., a voltage level that is about twice the power-supply voltage) can be provided to the voltage controlled oscillator (VCO) 860.

Therefore, the clock generator 800 based on some implementations of the disclosed technology can improve the operation speed of the voltage controlled oscillator (VCO) 860 by supplying the pumped voltage which is the increased control voltage Vi to the voltage controlled oscillator (VCO) 860.

Figure 3:
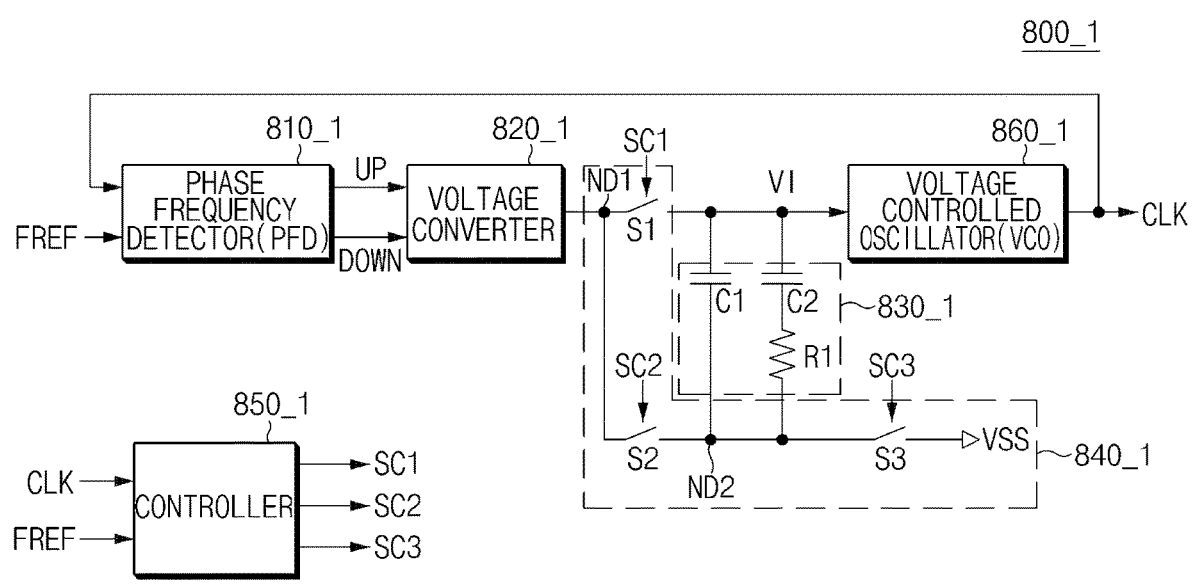
FIG. 3 is a schematic diagram illustrating a representation of an example of the clock generator shown in FIG. 1 based on some implementations of the disclosed technology.

FIG. 3 is a schematic diagram illustrating another example of the clock generator shown in FIG. 1. Referring to FIG. 3, the clock generator 800_1 may include a phase frequency detector (PFD) 810_1, a voltage converter 820_1, a filter circuit 830_1, a voltage pumping circuit 840_1, a controller 850_1, and a voltage controlled oscillator (VCO) 860_1.

Differently from the clock generator 800 shown in FIG. 2, the clock generator 800_1 shown in FIG. 3 may include a controller 850_1 that is different in structure from the controller 850 shown in FIG. 2. The detailed descriptions of the elements of FIG. 4 as same as those in FIG. 2 will be omitted for convenience of description.

The controller 850_1 shown in FIG. 3 may compare a clock signal CLK with a reference clock signal FREF, such that the controller 850_1 may control switching of the plurality of switching element control signals SC1 to SC3 based on the result of comparison between the clock signal CLK and the reference clock signal FREF.

In a normal operation, the controller 850_1 may activate the switching control signals SC1 and SC2 such that the filter circuit 830_1 may perform a filtering operation. The controller 850_1 may activate the switching control signal SC2 when the clock signal CLK is higher than the reference clock signal FREF. When the switching element SC2 is turned on, the pumping operation proceeds such that the level of the control voltage (VI) increases by electric charges stored in capacitors C1 and C2.

Figure 4:
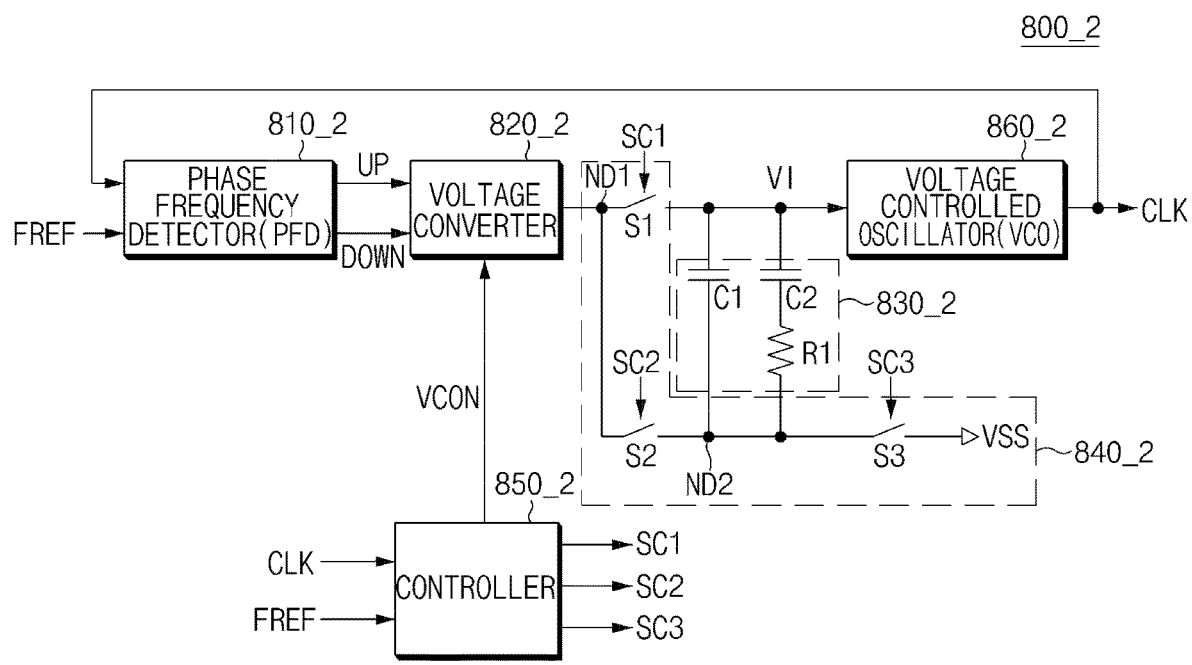
FIG. 4 is a schematic diagram illustrating a representation of an example of the clock generator shown in FIG. 1 based on some implementations of the disclosed technology.

FIG. 4 is a schematic diagram illustrating yet another example of the clock generator shown in FIG. 1.

Referring to FIG. 4, the clock generator 800_2 may include a phase frequency detector (PFD) 810_2, a voltage converter 820_2, a filter circuit 830_2, a voltage pumping circuit 840_2, a controller 850_2, and a voltage controlled oscillator (VCO) 860_2.

Differently from the clock generator 800 shown in FIG. 2, the clock generator 800_2 shown in FIG. 4 may include a controller 850_2 that is different in structure from the controller 850 shown in FIG. 2. The detailed descriptions on the elements of FIG. 4 as same as those in FIG. 2 will be omitted for convenience of description.

The controller 850_2 shown in FIG. 4 may control an initial voltage of the voltage converter 820_2 using a voltage control signal VCON. For example, the operation range of the voltage converter 820_2 may be limited within the range between the power-supply voltage (VDD) level and the ground voltage (VSS) level. In this implementation, the voltage control signal VCON may allow the voltage converter 820_2 to provide a supply voltage higher than the power-supply voltage (VDD) during an initial certain period. Therefore, the voltage converter 820_2 may generate the control voltage VI that is equal to or higher than the power-supply voltage (VDD) level.

In the normal operation, the controller 850_2 may activate the switching control signals SC1 and SC3 such that the filter circuit 830_2 may perform a filtering operation. The controller 850_2 may activate the switching control signal SC2 when the clock signal CLK is higher than the reference clock signal FREF. When the switching element SC2 is turned on, the pumping operation proceeds such that the control voltage (VI) level may increase by electric charges stored in capacitors C1 and C2.

Figure 5:
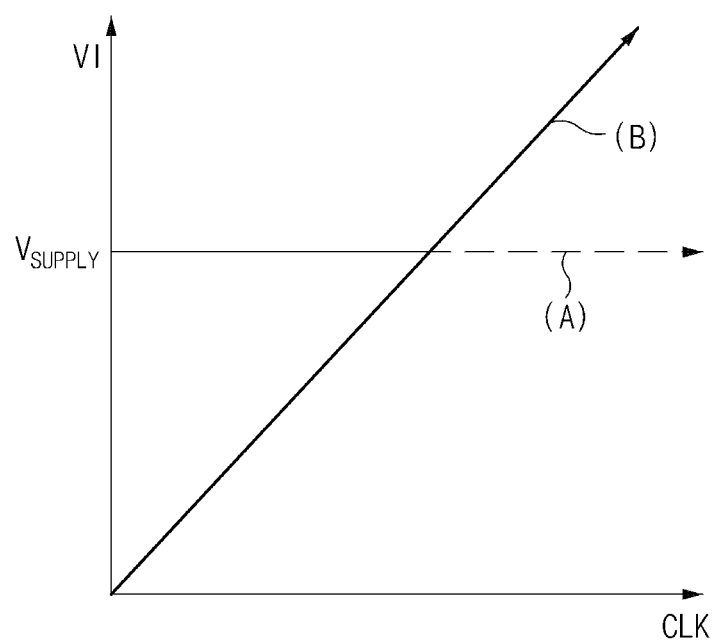
FIG. 5 is a graph illustrating operations of the clock generator based on some implementations of the disclosed technology.

FIG. 5 is a graph illustrating operations of the clock generator 800 based on some implementations of the disclosed technology.

Referring to FIG. 5, an X-axis may denote the clock signal CLK, and a Y-axis may denote the control voltage VI.

Graph (A) shows the control voltage VI of the image sensor without the voltage pumping circuit and graph (B) shows the control voltage VI of the image sensor based on some implementations of the disclosed technology. In the image sensor without the voltage pumping circuit, the control voltage VI gradually increases and is then kept at a supply voltage (VSUPPLY) level (e.g., a voltage supplied to the voltage converter) as shown in (A) of FIG. 5. In contrast, the clock generator based on some implementations of the disclosed technology may allow the control voltage (VI) level to be higher than the supply voltage (VSUPPLY) level as shown in (B) of FIG. 5. As a result, the clock generator based on some implementations of the disclosed technology can allow the control voltage (VI) level to be higher than the supply voltage (VSUPPLY) level, resulting in improvement in the operation speed of the voltage controlled oscillator 860.

As is apparent from the above description, the clock generator and the image sensor including the same based on some implementations of the disclosed technology can process signals at a higher speed by extending an output range of a voltage controlled oscillator.

Only a few implementations and examples are described and other implementations, enhancements and variations can be made based on what is described and illustrated in this patent document.

What is claimed is:

1. A clock generator comprising:
a phase frequency detector (PFD) configured to receive a clock signal and a reference clock signal and detect a phase difference between the clock signal and the reference clock signal, the phase frequency detector providing a first output signal based on the phase difference;
a voltage converter communicatively coupled to the phase frequency detector to receive the first output signal from the phase frequency detector and configured to provide a second output signal based on the first output signal from the phase frequency detector (PFD);
a filter circuit communicatively coupled to the voltage converter to receive the second output signal from the voltage converter and configured to generate a control voltage during a first operation by filtering the second output signal from the voltage converter;
a voltage pumping circuit communicatively coupled to the voltage converter and configured to pump an output voltage of the voltage converter after the first operation, the voltage pumping circuit providing a pumped control voltage having a pumped voltage level that is a sum of the control voltage and the output voltage of the voltage converter; and
a voltage controlled oscillator communicatively coupled to the filter circuit and the voltage pumping circuit and configured to generate the clock signal having an oscillation frequency that is determined based on the control voltage or the pumped control voltage,
wherein the voltage pumping circuit comprises switching elements that are selectively turned on to provide different current paths from the voltage converter to the voltage controlled oscillator,
wherein some of the switching elements are turned on to form a normal path in which the control voltage is charged in the filter circuit during the first operation, and when the output voltage of the voltage converter becomes higher than a reference voltage after the first operation, a remaining switching element among the switching elements is turned on while turning off the some of the switching elements to form a pumping path for pumping the voltage charged to the filter circuit by the output voltage of the voltage converter so that the pumping path conducts a current from the voltage converter, through the remaining switching element and the filter circuit, to the voltage controlled oscillator.

2. The clock generator according to claim 1, wherein the voltage converter includes a voltage-to-current converter.

3. The clock generator according to claim 1, wherein the filter circuit includes a low pass filter (LPF).

4. The clock generator according to claim 1, wherein the filter circuit comprises at least two capacitors and a resistor coupled to one of the at least two capacitors.

5. The clock generator according to claim 1, wherein the different paths include the normal path allowing current flowing through the filter circuit and the pumping path allowing current flowing through the voltage pumping circuit.

6. The clock generator according to claim 1, wherein the voltage converter stops its operation when the second output signal from the voltage converter is higher than a predetermined level.

7. The clock generator according to claim 1, wherein the switching elements of the voltage pumping circuit comprise:
a first switching element coupled between an output node of the voltage converter and an input terminal of the control voltage, and configured to be controlled by a first switching control signal;
a second switching element coupled between the output node and a second node, and configured to be controlled by a second switching control signal; and
a third switching element coupled between the second node and a ground voltage input terminal, and configured to be controlled by a third switching control signal.

8. The clock generator according to claim 7, further comprising:
a controller configured to selectively activate at least one of the first switching control signal, the second switching control signal, or the third switching control signal.

9. The clock generator according to claim 1, further comprising a controller configured to control whether to operate the filter circuit or the voltage pumping circuit based on a result of comparison between the control voltage and the reference voltage.

10. The clock generator according to claim 1, further comprising a controller configured to control whether to operate the filter circuit or the voltage pumping circuit based on a result of comparison between the clock signal and the reference clock signal.

11. The clock generator according to claim 1, further comprising a controller configured to control an initial voltage of the voltage converter such that the initial voltage of the voltage converter is higher than a power-supply voltage.

12. A clock generator comprising:
a voltage converter configured to perform a voltage conversion operation;
a filter circuit configured to store charges and configured to generate a control voltage by filtering an output from the voltage converter;
a voltage pumping circuit configured to operate, during a pumping operation, to generate a pumped control voltage by using the charges stored in the filter circuit, the pumped control voltage being higher than the control voltage; and
a voltage controlled oscillator configured to generate a clock signal having an oscillation frequency that is determined based on the control voltage during a normal operation and based on the pumped control voltage during the pumping operation, wherein the control voltage is generated in the filter circuit during the normal operation, and the pumped control voltage is provided by adding the control voltage and the output voltage of the voltage converter during the pumping operation, wherein the voltage pumping circuit comprises switching elements that are selectively turned on to provide different current paths from the voltage converter to the voltage controlled oscillator, wherein some of the switching elements are turned on to form a normal path in which the control voltage is charged in the filter circuit during the normal operation, and when the output voltage of the voltage converter becomes higher than a reference voltage after the normal operation, the remaining switching element among the switching elements is turned on while turning off the some of the switching elements to form a pumping path for pumping the voltage charged to the filter circuit by the output voltage of the voltage converter so that the pumping path conducts a current from the voltage converter, through the remaining switching element and the filter circuit, to the voltage controlled oscillator.

13. The clock generator according to claim 12, wherein the filter circuit comprises at least one capacitor and a resistor.

14. The clock generator according to claim 12, wherein the switching elements of the voltage pumping circuit comprise:
a first switching element coupled between a first node and a node to which the control voltage or the pumped control voltage is applied, the first switching element configured to be controlled by a first switching control signal;
a second switching element coupled between the first node and a second node, and configured to be controlled by a second switching control signal; and
a third switching element coupled between the second node and a ground, and configured to be controlled by a third switching control signal.

15. The clock generator according to claim 14, further comprising:
a controller configured to activate the first switching control signal and the third switching control signal in the normal operation and activate the second switching control signal in the pumping operation.

16. An image sensor comprising:
an analog-to-digital converter (ADC) circuit configured to convert a plurality of pixel signals into at least one digital signal;
a data output circuit configured to receive the at least one digital signal from the ADC circuit and outputting pixel data based on the at least one digital signal;
a digital processing circuit configured to receive the pixel data from the data output circuit and perform a signal processing of the pixel data based on a clock signal; and
a clock generator configured to generate the clock signal, wherein the clock generator comprises:
a voltage converter configured to perform voltage conversion operation;
a filter circuit configured to store charges and configured to generate a control voltage by filtering an output from the voltage converter, a voltage pumping circuit configured to operate, during a pumping operation, to generate a pumped control voltage by using the charges stored in the filter circuit, the pumped control voltage to be equal to or higher than a power-supply voltage, and a voltage controlled oscillator configured to generate the clock signal having an oscillation frequency that is determined based on the control voltage during a normal operation and based on the pumped control voltage during the pumping operation, wherein the control voltage is generated in the filter circuit during the normal operation, and the pumped control voltage is provided by adding the control voltage and the output voltage of the voltage converter during the pumping operation, wherein the voltage pumping circuit comprises switching elements that are selectively turned on to provide different current paths from the voltage converter to the voltage controlled oscillator, wherein some of the switching elements are turned on to form a normal path in which the control voltage is charged in the filter circuit during the normal operation, and when the output voltage of the voltage converter becomes higher than a reference voltage after the normal operation, a remaining switching element among the switching elements is turned on while turning off the some of the switching elements to form a pumping path for pumping the voltage charged to the filter unit by the output voltage of the voltage converter so that the pumping path conducts a current from the voltage converter, through the remaining switching element and the filter circuit, to the voltage controlled oscillator.

17. The image sensor according to claim 16, wherein the clock generator further comprises:
a phase frequency detector (PFD) configured to detect a phase difference between the clock signal and a reference clock signal,
wherein the voltage converter is configured to provide an output signal based on the phase difference detected by the phase frequency detector (PFD).

18. The image sensor according to claim 16, wherein the switching elements of the voltage pumping circuit comprise:
a first switching element coupled between a first node and a node at which the control voltage or the pumped control voltage is applied, and configured to be controlled by a first switching control signal;
a second switching element coupled between the first node and a second node, and configured to be controlled by a second switching control signal; and
a third switching element coupled between the second node and a ground and configured to be controlled by a third switching control signal.

19. The image sensor according to claim 18, further comprising:
a controller configured to activate the first switching control signal and the third switching control signal in the normal operation and activate the second switching control signal in the pumping operation.

20. The image sensor according to claim 19, wherein the controller is configured to control the first switching control signal, the second switching control signal, and the third switching control signal based on a result of a comparison between the control voltage and the reference voltage.

* * * * *